US012230679B2

(12) United States Patent
Ouchi et al.

(10) Patent No.: US 12,230,679 B2
(45) Date of Patent: Feb. 18, 2025

(54) COMPOUND SEMICONDUCTOR SUBSTRATE INCLUDING NITRIDE SEMICONDUCTOR LAYER HAVING VARYING THREADING DISLOCATION DENSITIES

(71) Applicant: AIR WATER INC., Osaka (JP)

(72) Inventors: Sumito Ouchi, Nagano (JP); Hiroki Sukuki, Nagano (JP); Mitsuhisa Narukawa, Nagano (JP); Keisuke Kawamura, Nagano (JP)

(73) Assignee: Air Water Inc., Osaka (JP)

( * ) Notice: Subject to any disclaimer, the term of this patent is extended or adjusted under 35 U.S.C. 154(b) by 645 days.

(21) Appl. No.: 17/417,950

(22) PCT Filed: Dec. 10, 2019

(86) PCT No.: PCT/JP2019/048179
§ 371 (c)(1),
(2) Date: Jun. 24, 2021

(87) PCT Pub. No.: WO2020/137501
PCT Pub. Date: Jul. 2, 2020

(65) Prior Publication Data
US 2022/0077288 A1    Mar. 10, 2022

(30) Foreign Application Priority Data
Dec. 25, 2018  (JP) .................. 2018-241389

(51) Int. Cl.
*H01L 29/20*     (2006.01)
*H01L 29/06*     (2006.01)
(Continued)

(52) U.S. Cl.
CPC ........ *H01L 29/205* (2013.01); *H01L 29/0684* (2013.01); *H01L 29/2003* (2013.01);
(Continued)

(58) Field of Classification Search
CPC .............. H01L 29/205; H01L 29/0684; H01L 29/2003; H01L 29/267; H01L 29/778; H01L 29/32; H01L 2924/13064
See application file for complete search history.

(56) References Cited

U.S. PATENT DOCUMENTS 4,197,141 A * 4/1980 Bozler .................. H01L 21/321
 136/258
10,535,801 B2 * 1/2020 Liao ...................... H01L 33/007
(Continued)

FOREIGN PATENT DOCUMENTS

EP    3550592 A1    11/2017
EP    3270409 A1    1/2018
(Continued)

OTHER PUBLICATIONS

Office Action issued May 17, 2023, in Taiwan Patent Application No. 108146595.
(Continued)

*Primary Examiner* — Ida M Soward
(74) *Attorney, Agent, or Firm* — Wood, Phillips, Katz, Clark & Mortimer

(57) ABSTRACT

A compound semiconductor substrate has a Si (silicon) substrate, a first Al nitride semiconductor layer which is a graded layer formed on the Si substrate and whose Al concentration decreases as the distance from the Si substrate increases along the thickness direction, a GaN (gallium nitride) layer formed on the first Al nitride semiconductor layer and having a lower average Al concentration than the average Al concentration of the first Al nitride semiconductor layer, and a second Al nitride semiconductor layer formed on the GaN layer and having a higher average Al concentration than the average Al concentration of the GaN layer. The threading dislocation density at any position in the thickness direction within the second Al nitride semicon- (Continued)

ductor layer is lower than the threading dislocation density at any position in the thickness direction within the first Al nitride semiconductor layer.

9 Claims, 12 Drawing Sheets

(51) Int. Cl.
      *H01L 29/205*     (2006.01)
      *H01L 29/26*      (2006.01)
      *H01L 29/267*     (2006.01)
      *H01L 29/32*      (2006.01)
      *H01L 29/778*     (2006.01)

(52) U.S. Cl.
    CPC ............ *H01L 29/267* (2013.01); *H01L 29/32* (2013.01); *H01L 29/778* (2013.01); *H01L 2924/13064* (2013.01)

(56) References Cited

U.S. PATENT DOCUMENTS

| | | | | |
|---|---|---|---|---|
| 2004/0188693 A1* | 9/2004 | Nakayama | .......... | H01L 21/0237 257/E21.127 |
| 2005/0110043 A1* | 5/2005 | Otsuka | .............. | H01L 29/66462 257/E29.317 |
| 2007/0007547 A1* | 1/2007 | Beach | ................. | H01L 29/7787 257/E29.247 |
| 2008/0220555 A1 | 9/2008 | Saxler et al. | | |
| 2010/0051961 A1* | 3/2010 | Kuraoka | ........... | H01L 29/66462 257/E29.104 |
| 2010/0213577 A1* | 8/2010 | Kato | ..................... | H01L 29/151 257/E29.089 |
| 2011/0049681 A1* | 3/2011 | Vielemeyer | ....... | H01L 21/02458 257/E29.004 |
| 2011/0062556 A1* | 3/2011 | Komiyama | ....... | H01L 21/02458 257/E29.089 |
| 2012/0074385 A1* | 3/2012 | Tak | ................... | H01L 21/02642 257/190 |
| 2012/0211801 A1* | 8/2012 | Hashimoto | ......... | H01L 29/7785 257/E29.091 |
| 2012/0292593 A1* | 11/2012 | Shioda | .............. | H01L 21/02576 257/E29.089 |
| 2013/0062612 A1 | 3/2013 | Shioda et al. | | |
| 2013/0069039 A1* | 3/2013 | Arkun | ................. | H01L 21/0259 257/14 |
| 2013/0140525 A1 | 6/2013 | Chen et al. | | |
| 2013/0330913 A1* | 12/2013 | Iwaya | ................. | H01L 29/2003 438/478 |
| 2014/0087113 A1* | 3/2014 | Hashimoto | ............. | C30B 7/105 428/58 |
| 2014/0091318 A1 | 4/2014 | Ishiguro et al. | | |
| 2014/0138699 A1* | 5/2014 | Hikosaka | ............... | H01L 29/205 438/478 |
| 2014/0332821 A1* | 11/2014 | Jang | .................... | H01L 29/7787 257/76 |
| 2014/0361345 A1* | 12/2014 | Kaneko | ................... | H01L 33/06 257/200 |
| 2015/0083994 A1* | 3/2015 | Jain | ..................... | H01L 33/0025 438/37 |
| 2015/0318448 A1* | 11/2015 | Nan | ..................... | H01L 21/0254 438/37 |
| 2016/0247886 A1* | 8/2016 | Lin | ................... | H01L 21/02502 |
| 2017/0229549 A1* | 8/2017 | Derluyn | .............. | H01L 29/7787 |
| 2017/0271493 A1* | 9/2017 | Yoshioka | .......... | H01L 29/66462 |
| 2018/0122987 A1* | 5/2018 | Shatalov | ................ | H01L 33/46 |
| 2018/0323071 A1* | 11/2018 | Shatalov | ............. | H01L 21/0254 |
| 2018/0337306 A1* | 11/2018 | Matsumoto | ........... | C30B 29/406 |

FOREIGN PATENT DOCUMENTS

| | | |
|---|---|---|
| JP | 2010-521065 A | 6/2010 |
| JP | 2013070013 A | 4/2013 |
| JP | 2014-053385 A | 3/2014 |
| JP | 2016-167472 A | 9/2016 |
| JP | 2019-102767 A | 6/2019 |
| WO | 2007/077666 A1 | 6/2009 |
| WO | 2017/069087 A1 | 4/2017 |
| WO | 2018101367 A1 | 7/2018 |

OTHER PUBLICATIONS

International Preliminary Report on Patentability and Written Opinion of the International Search Authority, issued Jun. 16, 2021 in International Patent Application No. PCT/JP2019/048179.
Extended European Search Report, issued Jan. 21, 2022 in European Patent Application No. 19903394.5.
Office Action issued Dec. 7, 2021, in Japanese Patent Application No. 2018-241389.
Office Action issued Apr. 27, 2022 in Japanese Patent Application No. 2018-241389.
Office Action issued Jan. 5, 2024, in Chinese Patent Application No. 201980086082.7.

\* cited by examiner

FIG. 7

| SAMPLES | EXAMPLE A THE INVENTION | COMPARATIVE EXAMPLE B |
|---|---|---|
| THREADING DISLOCATION DENSITY DC AT POSITION P3 IN GaN LAYER 51a | $2.2 \times 10^9$ pieces $/cm^2$ | $3.8 \times 10^9$ pieces $/cm^2$ |
| THREADING DISLOCATION DENSITY DB AT POSITION P2 IN Al NITRIDE LAYER 41b | $5.2 \times 10^9$ pieces $/cm^2$ | $7.2 \times 10^9$ pieces $/cm^2$ |
| THREADING DISLOCATION DENSITY DA AT POSITION P1 IN Al NITRIDE LAYER 41a | $9.6 \times 10^9$ pieces $/cm^2$ | $1.1 \times 10^{10}$ pieces $/cm^2$ |
| RATIO (DC/DA) | 0.23 | 0.35 |
| RATIO (DB/DA) | 0.55 | 0.67 |

FIG. 8
INVENTION EXAMPLE A
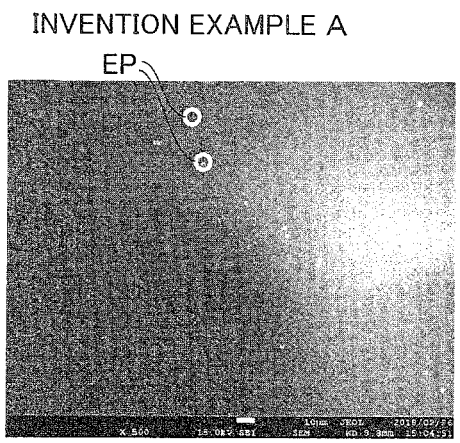
ETCH PITS (L) DENDITY : $7.87 \times 10^4 / cm^2$
COMPARATIVE EXAMPLE B
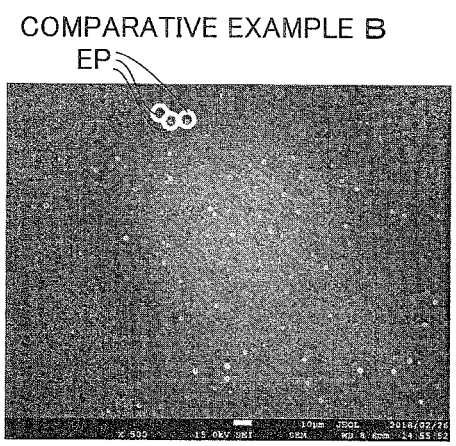
ETCH PITS (L) DENDITY : $2.78 \times 10^5 / cm^2$
INVENTION EXAMPLE A
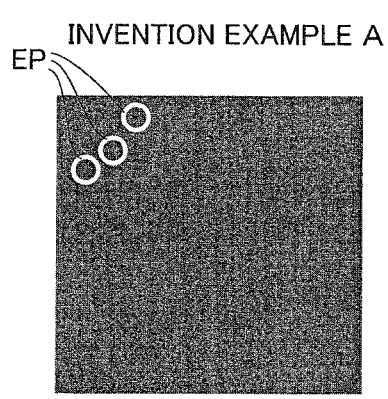
ETCH PITS (S) DENDITY · $1.04 \times 10^8 / cm^2$
COMPARATIVE EXAMPLE B
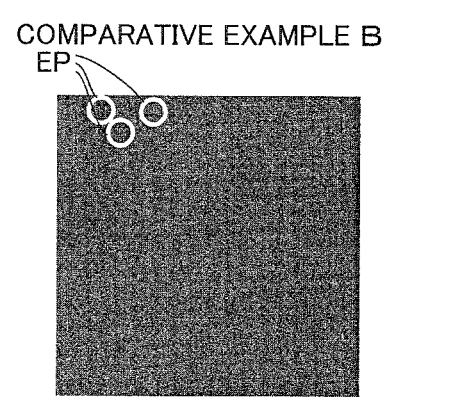
ETCH PITS (S) DENDITY · $1.40 \times 10^8 / cm^2$

FIG. 9

| SAMPLE | SAMPLE C1 | SAMPLE C2 | SAMPLE C3 |
|---|---|---|---|
| Al NITRIDE LAYER 52b THICK/ AlN NITRIDE LAYER 52a THICK | 15nm/15nm (fixed) | | |
| GaN LAYER 42b THICK/ GaN LAYER42a THICK | 15nm/15nm | 45nm/15nm | 60nm/15nm |
| WARPAGE | CONVEX 90 μm | CONVEX 15 μm | CONCAVE 39 μm |

FIG. 11

| SAMPLE | SAMPLE D1 | SAMPLE D2 | SAMPLE D3 |
|---|---|---|---|
| Al NITRIDE LAYER 52b THICK/ AlN NITRIDE LAYER 52a THICK | 15nm/15nm | 15nm/10nm | 10nm/10nm |
| GaN LAYER 42b THICK/ GaN LAYER 42a THICK | 15nm/15nm (FIXED) | | |
| WARPAGE | CONVEX 90 μm | CONVEX 23 μm | CONCAVE 46 μm |

COMPOUND SEMICONDUCTOR SUBSTRATE INCLUDING NITRIDE SEMICONDUCTOR LAYER HAVING VARYING THREADING DISLOCATION DENSITIES

TECHNOLOGICAL FIELD

The present invention relates to a compound semiconductor substrate. More specifically, the present invention relates to a compound semiconductor substrate that can reduce threading dislocations in a nitride semiconductor layer including Al (aluminum).

DESCRIPTION OF THE RELATED ART

GaN (gallium nitride) is known as a wide band gap semiconductor material, which has a larger band gap and higher insulation breakdown field strength than Si (silicon). Since GaN has a higher dielectric breakdown resistance than other wide band gap semiconductor materials, it is expected to be applied to next-generation low-loss power devices.

When a Si substrate is used for a start substrate (foundation substrate) of a semiconductor device using GaN, due to large differences in the lattice constants value and thermal expansion coefficients between GaN and Si, phenomenon in which warpage occurs in the substrate and cracks occur in a GaN layer is likely to be caused. For this reason, a technique has been proposed to reduce the difference in the lattice constant values and the thermal expansion coefficients between GaN and Si by a SiC layer or the like to adopt a compound semiconductor substrate in which the SiC (silicon carbide) layer or the like was formed on the Si substrate as the start substrate.

As such a technique, the Patent Document 1 below and the like disclose a technique for suppressing the occurrence of warpage and cracks in the substrate. The Patent Document 1 discloses a compound semiconductor substrate comprising a SiC layer, an AlN (aluminum nitride) buffer layer formed on the SiC layer, a nitride semiconductor layer containing Al formed on the AlN buffer layer, a first GaN layer formed on the nitride semiconductor layer, a first AlN intermediate layer formed on the first GaN layer and in contact with the first GaN layer, and a second GaN layer formed on the first AlN intermediate layer and in contact with the first AlN intermediate layer.

A conventional semiconductor substrate equipped with a GaN layer is also disclosed in Patent Document 2 below. Patent Document 2 below discloses a semiconductor structure comprising a substrate consisting of SiC, a nucleation layer consisting of AlN formed on the substrate, a graded layer consisting of AlGaN (aluminum nitride gallium) formed on the nucleation layer, and a nitride layer consisting of GaN formed on the graded layer.

PRIOR ART DOCUMENT

Document(s) Related to Patents

[Patent Document 1] International publication No. 2017/069087

[Patent Document 2] Japanese Translation of PCT International Application Publication No. 2010-521065

Problems to be Resolved by this Invention

According to the conventional semiconductor substrate equipped with a GaN layer, a nitride semiconductor layer containing Al (AlGaN, etc.) was often used as a buffer layer. However, the conventional nitride semiconductor layer containing Al had a problem that there were many internal threading dislocations. When a GaN layer is formed on a nitride semiconductor layer containing Al, threading dislocations were carried over to the GaN layer, and threading dislocations in the GaN layer were also increased.

The present invention is to solve the above problems, the purpose is to provide a compound semiconductor substrate that can reduce threading dislocations within the nitride semiconductor layer containing Al.

SUMMARY OF THE INVENTION

According to an aspect of the invention, a compound semiconductor substrate comprising: a Si substrate, a first nitride semiconductor layer containing Al formed on the Si substrate, as a graded layer in which an Al concentration decreases as a distance from the Si substrate increases along a thickness direction, a second nitride semiconductor layer formed on the first nitride semiconductor layer and having a lower average Al concentration than the average Al concentration of the first nitride semiconductor layer, and a third nitride semiconductor layer containing Al formed on the second nitride semiconductor layer and having a higher average Al concentration than the average Al concentration of the second nitride semiconductor layer, wherein a threading dislocation density at any position in a thickness direction within the third nitride semiconductor layer is lower than a threading dislocation density at any position in a thickness direction within the first nitride semiconductor layer.

Preferably, according to the compound semiconductor, the second nitride semiconductor layer is made of GaN and has a thickness of 3 nanometers or more and 100 nanometers or less.

Preferably, according to the compound semiconductor, the first nitride semiconductor layer includes a lower layer, and an upper layer formed on the lower layer and having a lower average Al concentration than an average Al concentration of the lower layer.

Preferably, according to the compound semiconductor, when a threading dislocation density at any position in a thickness direction within the first nitride semiconductor layer is threading dislocation density DA, and a threading dislocation density at any position in a thickness direction within the third nitride semiconductor layer is threading dislocation density DB, a ratio (DB/DA) of threading dislocation density DB to threading dislocation density DA is greater than 0 and less than or equal to 0.6.

Preferably, according to the compound semiconductor, a ratio (W2/W1) of the second nitride semiconductor layer thickness W2 to a first nitride semiconductor layer thickness W1 is 0.007 or more and 0.26 or less.

Preferably, the compound semiconductor further comprising a GaN layer formed on the third nitride semiconductor layer.

Preferably, according to the compound semiconductor, when a threading dislocation density at any position in a thickness direction within the first nitride semiconductor layer is threading dislocation density DA, and a threading dislocation density at any position in a thickness direction within the GaN layer is threading dislocation density DC, a ratio (DC/DA) of threading dislocation density DC to threading dislocation density DA is greater than 0 and less than or equal to 0.3.

Preferably, the compound semiconductor further comprising an upper composite layer, wherein the upper composite layer includes multiple upper GaN layers stacked in a vertical direction, and upper nitride semiconductor layer(s) containing Al formed between the multiple upper GaN layers, wherein the GaN layer is an upper GaN layer of the lowermost layer among the multiple upper GaN layers, and a ratio (W4/W3) of thickness W4 of the upper nitride semiconductor layer to thickness W3 of each of the multiple upper GaN layer is 0.0015 or more and 0.025 or less.

Preferably, the compound semiconductor further comprising a SiC layer formed on the Si substrate, and a buffer layer consisting of AlN formed on the SiC layer, wherein the first nitride semiconductor layer is formed on the buffer layer.

Effect of the Invention

According to the present invention, a compound semiconductor substrate which reduces threading dislocations in a nitride semiconductor layer including Al can be provided.

BRIEF DESCRIPTION OF THE DRAWINGS

FIG. 3 schematically shows the two-dimensional growth of GaN constituting GaN layer 42a.

FIG. 7 shows a table of the measurement result of the threading dislocation density in the first embodiment of the present invention.

FIG. 8 shows a micrograph and a measurement result of densities of etch pits on the surface of the most superficial layer (Al nitride semiconductor layer 10) of the compound semiconductor substrate in the first embodiment of the present invention.

FIG. 9 shows a table of the measurement result of warpage amounts of samples C1, C2, and C3 in the second embodiment of the present invention.

FIG. 11 shows a table of the measurement result of the warpage amounts of samples D1, D2, and D3 in the second embodiment of the present invention.

DETAILED DESCRIPTION OF EMBODIMENTS

Hereinafter, embodiments of the present invention will be described with reference to the drawings.

First Embodiment

Figure 1:
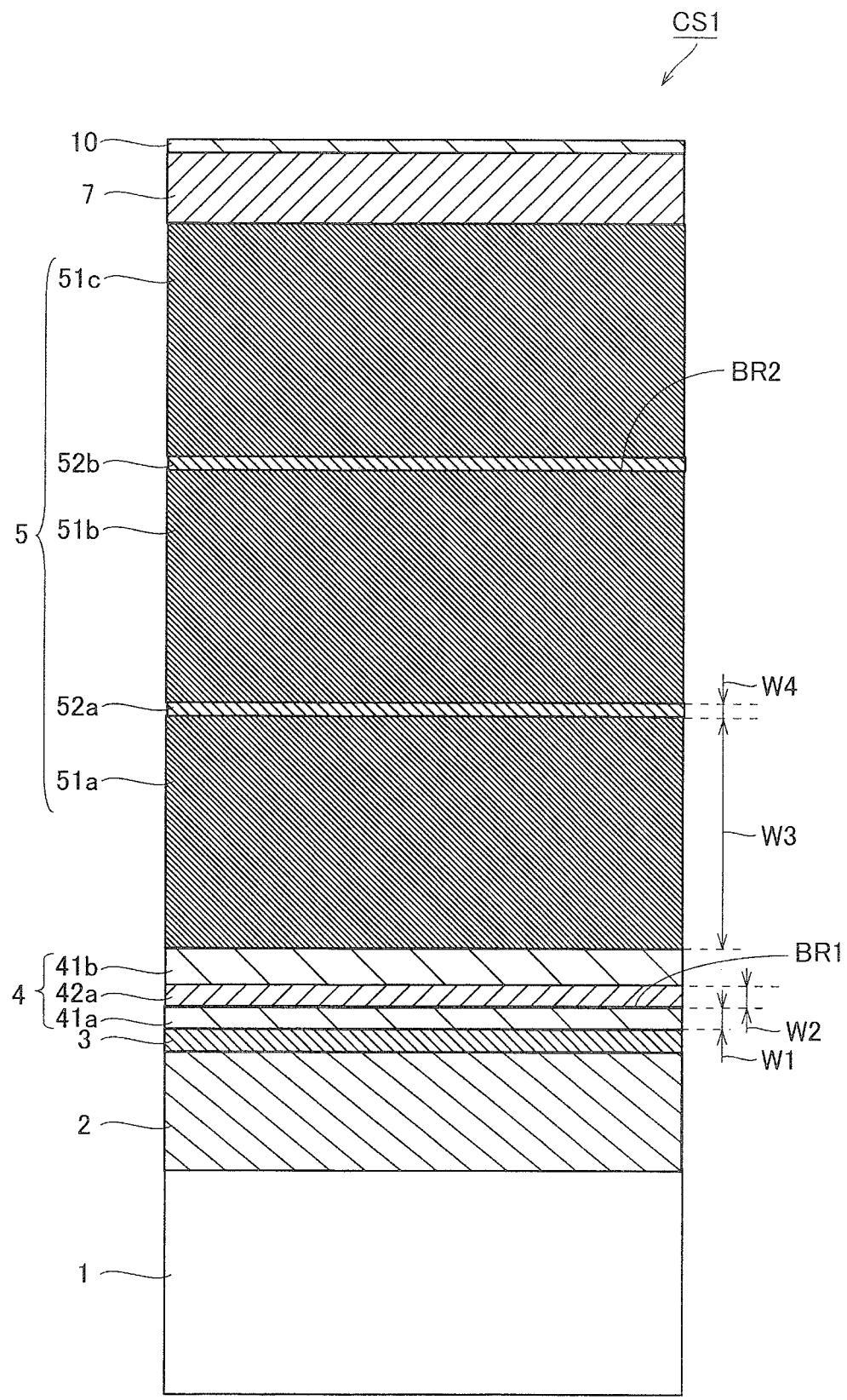
FIG. 1 shows a cross-sectional view showing the configuration of compound semiconductor substrate CS1 according to the first embodiment of the present invention.

FIG. 1 shows a cross-sectional view showing the configuration of compound semiconductor substrate CS1 according to the first embodiment of the present invention.

With reference to FIG. 1, compound semiconductor substrate CS1 in this embodiment includes a HEMT (High Electron Mobility Transistor). Compound semiconductor substrate CS1 comprises Si substrate 1 (an example of a Si substrate), SiC layer 2 (an example of a SiC layer), AlN buffer layer 3 (an example of a buffer layer), composite layer 4, composite layer 5 (an example of an upper composite layer), GaN layer 7, and Al nitride semiconductor layer 10.

Si substrate 1 consists of, for example, p+ type Si. The (111) plane is exposed on the surface of Si substrate 1. Note that Si substrate 1 may have a n-type conductivity or may be semi-insulating. The (100) surface or the (110) surface may be exposed on the surface of Si substrate 1. Si substrate 1 has a diameter of, for example, 6 inches and a thickness of 1000 micrometers.

SiC layer 2 is in contact with Si substrate 1 and is formed on Si substrate 1. SiC layer 2 consists of 3C—SiC, 4H—SiC, 6H—SiC, or the like. In particular, when SiC layer 2 was epitaxially grown on Si substrate 1, SiC layer 2 typically consists of 3C—SiC.

SiC layer 2 may be formed using the MBE (Molecular Beam Epitaxy) method, the CVD (Chemical Vapor Deposition) method, the LPE (Liquid Phase Epitaxy) method, etc., by homo epitaxial growth of SiC on a foundation layer consisting of SiC obtained by carbonizing the surface of Si substrate 1. SiC layer 2 may be formed only by carbonizing the surface of Si substrate 1. Further, SiC layer 2 may be formed by hetero epitaxial growth on the surface of Si substrate 1 (or with a buffer layer interposed therebetween). SiC layer 2 is doped with N (nitrogen), for example, and has a conductivity type of n-type. SiC layer 2 has a thickness of, for example, 0.1 micrometers or more and 3.5 micrometers or less. Note that SiC layer 2 may have a p-type conductivity or may be semi-insulating.

As the foundation layer of AlN buffer layer 3, a layer made of any material can be used. As an example, AlN buffer layer 3 may be formed directly on Si substrate 1 without forming SiC layer 2 on Si substrate 1. In this case, the foundation layer of AlN buffer layer 3 is Si substrate 1. However, by forming SiC layer 2 between Si substrate 1 and AlN buffer layer 3, meltback etching (a phenomenon in which Ga in the GaN layer diffuses and reacts with Si in Si substrate 1 to destroy Si substrate 1) can be reliably suppressed by SiC layer 2.

AlN buffer layer 3 is in contact with SiC layer 2, and formed on SiC layer 2. AlN buffer layer 3 acts as a buffer layer that reduces the difference in the lattice constant values between SiC layer 2 and the Al nitride semiconductor layer that composes composite layer 4. AlN buffer layer 3 is formed using, for example, the MOCVD (Metal Organic Chemical Vapor Deposition) method. The growth temperature of AlN buffer layer 3 is, for example, 1000 degrees Celsius or more and less than the Si melting point. For example, TMA (Tri Methyl Aluminum), TEA (Tri Ethyl Aluminum), or the like is used as Al source gas. For example, $NH_3$ (ammonia) is used as N source gas. AlN buffer layer 3 has a thickness of, for example, 100 nanometers or more and 1000 nanometers or less.

Composite layer 4 is in contact with AlN buffer layer 3 and is formed on AlN buffer layer 3. Composite layer 4 includes stacked multiple Al nitride semiconductor layers in a vertical direction (same direction as the lamination direction of Si substrate 1, SiC layer 2 and AlN buffer layer 3, which is the vertical direction in FIG. 1), and GaN layer(s) formed between each 2 layers among multiple Al nitride semiconductor layers. In other words, composite layer 4 has a configuration in which Al nitride semiconductor layer(s) and GaN layer (s) are alternately stacked one or more times. The top layer and the bottom layer of composite layer 4 are both Al nitride semiconductor layers.

The number of Al nitride semiconductor layers constituting composite layer 4 may be 2 or more, and preferably 9 or less. The number of GaN layers constituting composite layer 4 may be 1 or more, and preferably 8 or less. Composite layer 4 in this embodiment includes 2 layers of Al nitride semiconductor layers 41*a* (an example of the first nitride semiconductor layer) and 41*b* (an example of the third nitride semiconductor layer) as Al nitride semiconductor layers and includes 1 layer of GaN layer 42*a* (an example of the second nitride semiconductor layer) as a GaN layer. Al nitride semiconductor layer 41*a* is formed at the position closest to Si substrate 1 among 2 layers of Al nitride semiconductor layers 41*a* and 41*b*, and in contact with AlN buffer layer 3. Al nitride semiconductor layer 41*b* is formed at the farthest position from Si substrate 1 among 2 layers of Al nitride semiconductor layers 41*a* and 41*b*. GaN layer 42*a* is formed between Al nitride semiconductor layer 41*a* and Al nitride semiconductor layer 41*b*. In other words, GaN layer 42*a* is formed on Al nitride semiconductor layer 41*a*, and Al nitride semiconductor layer 41*b* is formed on GaN layer 42*a*.

Each of the Al nitride semiconductor layers that make up composite layer 4 is made of nitride semiconductors containing Al, preferably AlGaN. Each of the Al nitride semiconductor layers that make up composite layer 4 consists of, for example, the material represented by $Al_xGa_{1-x}N$ ($0 < x \leq 1$). In this case, by setting the Al composition ratio x to 0.5 or more, the Ga composition ratio becomes 0.5 or less, and the effect of the warpage control by composite layer 4 can be increased. Further, each of the Al nitride semiconductor layers constituting composite layer 4 may be made of the material represented by $Al_xIn_yGa_{1-x-y}N$ ($0 < x \leq 1$, $0 \leq y < 1$). The Al nitride semiconductor layer that makes up composite layer 4 acts as a buffer layer that reduces the difference in the lattice constant values between AlN buffer layer 3 and the GaN layer in composite layer 5. The total film thickness of the Al nitride semiconductor layers that composes composite layer 4 is, for example, 100 nanometers or more and 3 micrometers or less, preferably 900 nanometers or more and 2 micrometers or less.

The Al nitride semiconductor layer that makes up composite layer 4 is formed using, for example, the MOCVD method. At this time, as Ga source gas, for example, TMG (Tri Methyl Gallium), TEG (Tri Ethyl Gallium), or the like is used. For example, TMA, TEA or the like is used as Al source gas. For example, $NH_3$ is used as N source gas.

As described below, the GaN layer that composes composite layer 4 plays a role in generating warpage of a concave shape in compound semiconductor substrate CS1.

The GaN layer that makes up composite layer 4 is formed using, for example, the MOCVD method. At this time, TMG, TEG or the like is used as Ga source gas, for example. For example, $NH_3$ is used as N source gas.

The GaN layer constituting composite layer 4 has a thickness of, for example, 3 nanometers or more and 100 nanometers or less, preferably 3 nanometers or more and 50 nanometers or less. When there are multiple GaN layers that make up composite layer 4, the GaN layers that make up composite layer 4 may have the same thickness or may have different thicknesses from each other.

Also, when the thickness of Al nitride semiconductor layer 41*a* is thickness W1 and the thickness of GaN layer 42*a* is thickness W2, the ratio of thickness W2 to thickness W1 (W2/W1) is preferably 0.007 or more and 0.26 or less.

Composite layer 5 is in contact with composite layer 4 (Al nitride semiconductor layer 41*b*) and is formed on composite layer 4 (Al nitride semiconductor layer 41*b*). Composite layer 5 includes multiple GaN layers and Al nitride semiconductor layer(s) formed between two layers among the multiple GaN layers stacked in a vertical direction (same direction as the lamination direction of Si substrate 1, SiC layer 2, AlN buffer layer 3, and composite layer 4, as the vertical direction in FIG. 1). In other words, composite layer 5 has a configuration in which GaN layers and Al nitride semiconductor layer(s) stacked alternately one or more times. The top layer and the bottom layer of composite layer 5 are both GaN layers.

The number of GaN layers constituting composite layer 5 may be 2 or more, and preferably 9 or less. The number of Al nitride semiconductor layers constituting composite layer 5 may be 1 or more, and preferably 8 or less. Composite layer 5 in this embodiment includes 3 GaN layers 51*a*, 51*b*, and 51*c* (an example of the upper GaN layer and GaN layers) as GaN layers, and 2 Al nitride semiconductor layers 52*a* and 52*b* (an example of the upper nitride semiconductor layer) as Al nitride semiconductor layers. GaN layer 51*a* is formed at the position closest to Si substrate 1 among 3 GaN layers 51*a*, 51*b*, and 51*c*, and is in contact with composite layer 4 (Al nitride semiconductor layer 41*b*). GaN layer 51*b* is formed at the position second closest to Si substrate 1 among 3 GaN layers 51*a*, 51*b*, and 51*c*. GaN layer 5i*c* is formed at the farthest position from Si substrate 1 among 3 GaN layers 51*a*, 51*b*, and 51*c*. Al nitride semiconductor layer 52*a* is formed between GaN layer 51*a* and GaN layer 51*b*. Al nitride semiconductor layer 52*b* is formed between GaN layer 51*b* and GaN layer 51*c*.

Each of the GaN layers that make up composite layer 5 is preferably doped with C (carbon). C plays a role in increasing the insulation of the GaN layers. The C-doped GaN layers preferably has average carbon atom concentration of $1*10^{18}$ pieces/$cm^3$ or more and $1*10^{21}$ pieces/$cm^3$ or less, and more preferably has average carbon concentration of $3*10^{18}$ pieces/$cm^3$ or more and $2*10^{19}$ pieces/$cm^3$ or less. When there are multiple GaN layers that are doped with C, those GaN layers may have the same average carbon atom concentration or different average carbon atom concentration from each other.

When doping GaN layer that makes up composite layer 5 with C, growth conditions of GaN are adopted so that C contained in TMG is incorporated into the GaN layer. As specific methods of doping the GaN layer with C, there are methods such as lowering the growth temperature of GaN, lowering the growth pressure of GaN, or increasing the molar flow ratio of TMG to $NH_3$.

Also, each of the GaN layers that make up composite layer 5 has a thickness of, for example, 550 nanometers or more and 3000 nanometers or less, preferably 800 nanometers or more and 2500 nanometers or less. The GaN layers that make up composite layer 5 may have the same thickness or different thicknesses from each other. The GaN layers that make up composite layer 5 is formed in the same way as the GaN layer that makes up composite layer 4.

As described below, the Al nitride semiconductor layer that composes composite layer 5 plays a role in generating warpage of a convex shape in compound semiconductor substrate CS1.

The Al nitride semiconductor layer that constitutes composite layer 5 consists of a nitride semiconductor containing Al, preferably AlN. The Al nitride semiconductor layer that makes up composite layer 5 consists of, for example, the material represented by $Al_xGa_{1-x}N$ (0<x≤1). In this case, by setting the Al composition ratio x to 0.5 or more, the Ga composition ratio becomes 0.5 or less, and the effect of the warpage control by composite layer 4 can be increased. Further, the Al nitride semiconductor layer constituting composite layer 5 may be made of the material represented by $Al_xIn_yGa_{1-x-y}N$ (0<x≤1, 0≤y<1).

The Al nitride semiconductor layer that constitutes composite layer 5 has a thickness of, for example, 3 nanometers or more and 50 nanometers or less, preferably 20 nanometers or less. When there are multiple Al nitride semiconductor layers that make up composite layer 5, the Al nitride semiconductor layers that make up composite layer 5 may have the same thickness or may have different thicknesses from each other. In addition, the Al composition ratio of each of the Al nitride semiconductor layers constituting composite layer 5 is arbitrary. The Al nitride semiconductor layers that make up composite layer 5 is formed in the same way as the Al nitride semiconductor layers that make up composite layer 4.

When the thickness of each of the GaN layers that make up composite layer 5 is W3, and the thickness of Al nitride semiconductor layer constituting composite layer 5 is W4, the ratio of thickness W4 to thickness W3 (W4/W3) is preferably 0.0015 or more and 0.025 or less.

GaN layer 7 is in contact with composite layer 5 and is formed on composite layer 5. GaN layer 7 is undoped and semi-insulating. GaN layer 7 becomes an electronic traveling layer of the HEMT. GaN layer 7 has a thickness of, for example, 100 nanometers or more and 1500 nanometers or less. GaN layer 7 is formed in the same way as the GaN layers that make up composite layer 4.

Al nitride semiconductor layer 10 is in contact with GaN layer 7 and is formed on GaN layer 7. Al nitride semiconductor layer 10 consists of a nitride semiconductor containing Al, for example the material represented by $Al_xGa_{1-x}N$ (0<x≤1). Also, Al nitride semiconductor layer 10 may consist of the material represented by $Al_xIn_yGa_{1-x-y}N$ (0<x≤1, 0≤y<1). Al nitride semiconductor layer 10 becomes a barrier layer of the HEMT. Al nitride semiconductor layer 10 has a thickness of, for example, 10 nanometers or more and 50 nanometers or less. Al nitride semiconductor layer 10 is formed in the same way as the GaN layers that make up composite layer 4.

Figure 2:
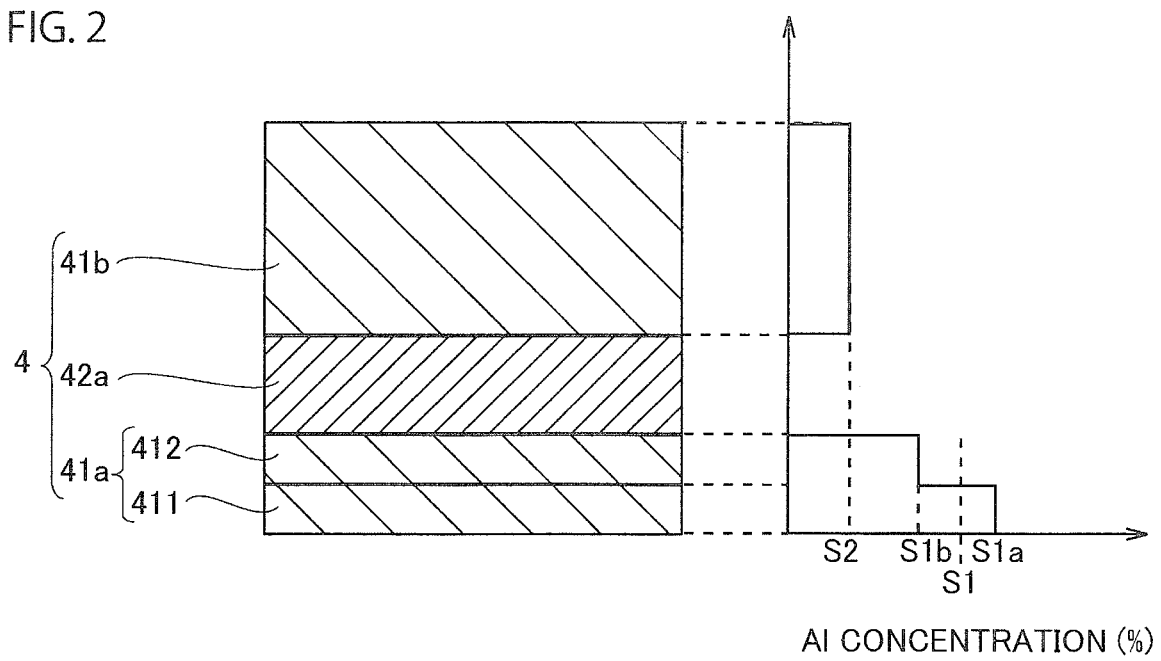
FIG. 2 shows the distribution of Al concentration inside composite layer 4 according to the first embodiment of the present invention.

FIG. 2 is a diagram showing the distribution of Al concentration inside composite layer 4 in first embodiment of the present invention.

With reference to FIG. 2, Al nitride semiconductor layer 41a is a graded layer whose Al concentration decreases with distance from Si substrate 1 along the thickness direction (upwardly in FIG. 1). In this embodiment, Al nitride semiconductor layer 41a includes the lower layer 411 (an example of the lower layer) and the upper layer 412 (an example of the upper layer) formed on the lower layer 411. Each of the lower layer 411 and the upper layer 412 has a uniform Al concentration distribution in the thickness direction. The average Al concentration of the lower layer 411 is concentration S1a, and the average Al concentration of the upper layer 412 is concentration S1b. The average Al concentration (concentration Si b) of the upper layer 412 is lower than the average Al concentration (concentration S1a) of the lower layer 411. The average Al concentration of Al nitride semiconductor layer 41a is the concentration Si.

Note that Al nitride semiconductor layer 41a may be a graded layer in which the Al concentration decreases at a constant rate with distance from Si substrate 1 in the thickness direction.

GaN layer 42a has an average Al concentration lower than the average Al concentration (concentration S1) of Al nitride semiconductor layer 41a. It goes without saying that the average Al concentration of GaN layer 42a is 0 (%). Note that the GaN layers in composite layer 4 may be replaced by an Al nitride semiconductor layer with an average Al concentration greater than 0 and lower than concentration S1.

Al nitride semiconductor layer 41b has an average Al concentration higher than the average Al concentration of GaN layer 42a. The average Al concentration of Al nitride semiconductor layer 41b is the concentration S2. Concentration S2 may be higher or lower than concentration S1.

The Al concentration of each layer constituting composite layer 4 can be adjusted by the concentration ratio of Al source gas in the source gases used when the film is formed by the MOCDV and by the film forming temperature. In addition, the Al concentration of each layer that composes composite layer 4 is measured by a method such as SIMS (Secondary Ion Mass Spectrometry). Further, the thickness of each layer that makes up the compound semiconductor substrate is measured by observing the cross section of the compound semiconductor substrate using a TEM (Transmission Electron Microscope).

Next, the effect of this embodiment will be described.

Figure 3:
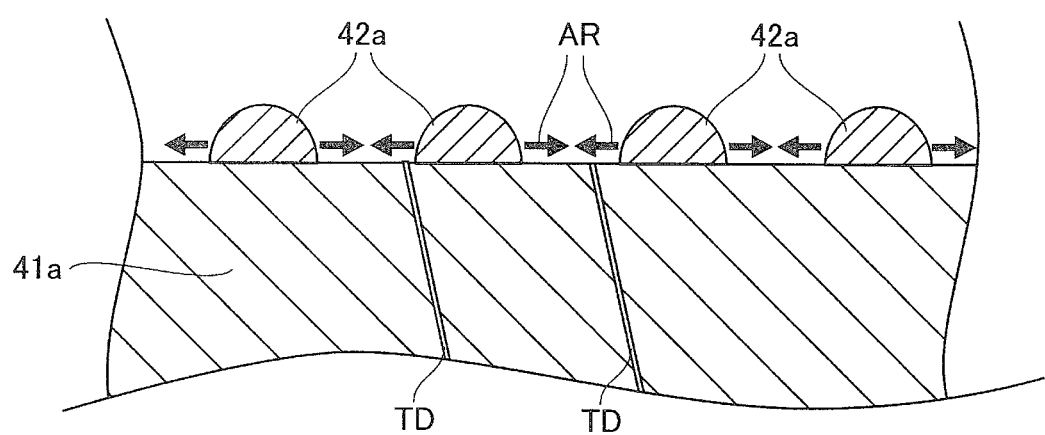

FIG. 3 schematically shows the two-dimensional growth of GaN that composes GaN layer 42a.

With reference to FIG. 3, the inventors of the present application formed GaN layer 42a (a nitride semiconductor layer with an average Al concentration lower than the average Al concentration of Al nitride semiconductor layer 41a) with the film forming temperature lower than the film forming temperature of Al nitride semiconductor layer 41a, on Al nitride semiconductor layer 41a as a graded layer, and found that the two-dimensional growth (growth in the direction indicated by the arrow in FIG. 3) of GaN was promoted. As a result, threading dislocation TD that existed in the lower layer is covered by GaN layer 42a, so that the threading dislocations of Al nitride semiconductor layer 41b, which is a layer above GaN layer 42a, can be reduced. As a result, the threading dislocations of GaN layers 51a, 51b, and 51c, which are layers above Al nitride semiconductor layer 41b, can be reduced.

In particular, the threading dislocation density at any position in the thickness direction within Al nitride semiconductor layer 41b is lower than the threading dislocation density at any position in the thickness direction within Al nitride semiconductor layer 41a. When the threading dislocation density at any position in the thickness direction within Al nitride semiconductor layer 41a is threading dislocation density DA, and the threading dislocation density at any position in the thickness direction within Al nitride semiconductor layer 41b is threading dislocation density DB, the ratio of threading dislocation density DB to threading dislocation density DA (DB/DA) is greater than 0 and less than or equal to 0.6. Further, when the threading dislocation density at any position in the thickness direction inside the GaN layer 51a, 51b, or 51c is the threading dislocation density DC, the ratio of threading dislocation density DC to threading dislocation density DA (DC/DA) is greater than 0 and less than or equal to 0.3.

In addition, according to this embodiment, the warpage of compound semiconductor substrate CS1 can be easily controlled.

In the following description, "a convex shape" and "a concave shape" mean a convex shape and a concave shape when Si substrate 1 is on the lower side and Al nitride semiconductor layer 10 is on the upper side.

With reference to FIG. 1, attention is paid to the relationship among GaN layer 42a in composite layer 4, Al nitride semiconductor layer 41a which is a foundation layer of GaN layer 42a, and Al nitride semiconductor layer 41b which is a layer above GaN layer 42a.

The boundary face BR1 between GaN layer 42a and Al nitride semiconductor layer 41a is a sliding surface. In other words, at the boundary face BR1, crystals of GaN layer 42a and crystals of Al nitride semiconductor layer 41a are an unconformity. For this reason, the effect of the crystal structure of Al nitride semiconductor layer 41a on the crystal structure of GaN layer 42a is small, and the effect of the lattice constant value of Al nitride semiconductor layer 41a on the lattice constant value of GaN layer 42a is small.

On the other hand, Al nitride semiconductor layer 41b grows to align with the crystal plane of the surface of GaN layer 42a as the foundation layer. For this reason, the crystal structure of Al nitride semiconductor layer 41b is influenced by the crystal structure of GaN layer 42a, and the lattice constant value of Al nitride semiconductor layer 41b is affected by the lattice constant value of GaN layer 42a. Since the lattice constant value of the material (AlGaN, AlN, etc.) that makes up Al nitride semiconductor layer 41b is smaller than the lattice constant value of GaN that makes up GaN layer 42a, the tension stress is added to Al nitride semiconductor layer 41b, and tensile strain is generated inside Al nitride semiconductor layer 41b. As the reaction of the tension stress, composite layer 4 causes compound semiconductor substrate CS1 to generate warpage of a concave shape.

By controlling the epitaxial growth condition (temperature, pressure, etc.) of GaN layer 42a, boundary face BR1 between GaN layer 42a and Al nitride semiconductor layer 41a can be a sliding surface. Also, by controlling the epitaxial growth condition (temperature, pressure, etc.) of Al nitride semiconductor layer 41b, Al nitride semiconductor layer 41b can be grown (coherent grown) so that slip does not occur on the crystal plane of the surface of GaN layer 42a.

The effect of composite layer 4 that generates warpage of a concave shape increases as the GaN layer that composes composite layer 4 becomes thicker. On the other hand, if the GaN layer that makes up composite layer 4 is too thick, cracks are likely to occur inside the GaN layer. In order to effectively generate warpage of a concave shape by composite layer 4 while suppressing the generation of cracks inside GaN layers that composes composite layer 4, the thickness of a GaN layer in composite layer 4 should be 3 nanometers or more and 100 nanometers or less, preferably 3 nanometers or more and 50 nanometers or less, and the number of GaN layers in composite layer 4 is preferably about 1 to 2.

Next, the relationship among Al nitride semiconductor layer 52b in composite layer 5, GaN layer 51b which is a foundation layer of Al nitride semiconductor layer 52b, and GaN layer 51c which is a layer above Al nitride semiconductor layer 52b is focused.

The boundary face BR2 between Al nitride semiconductor layer 52b and GaN layer 51b is a sliding surface. In other words, on boundary face BR2, crystals of Al nitride semiconductor layer 52b and crystals of GaN layer 51b are unconformity. For this reason, the effect of the crystal structure of GaN layer 51b on the crystal structure of Al nitride semiconductor layer 52b is small, and the effect of the lattice constant value of GaN layer 51b on the lattice constant value of Al nitride semiconductor layer 52b is small.

On the other hand, GaN layer 51c grows to align with the crystal plane of the surface of Al nitride semiconductor layer 52b as the foundation layer. For this reason, the crystal structure of GaN layer 51c is influenced by the crystal structure of Al nitride semiconductor layer 52b, and the lattice constant value of GaN layer 51c is affected by the lattice constant value of Al nitride semiconductor layer 52b. Since the lattice constant value of the GaN that composes GaN layer 51c is larger than the lattice constant value of the material that composes Al nitride semiconductor layer 52b (AlGaN, AlN, etc.), compression stress is added to GaN layer 51c, and compressive strain is generated inside GaN layer 51c. As reaction of the compression stress, composite layer 5 causes compound semiconductor substrate CS1 to generate warpage of a convex shape.

By controlling the epitaxial growth conditions (temperature, pressure, etc.) of the Al nitride semiconductor layer 52b, boundary face BR2 between Al nitride semiconductor layer 52b and GaN layer 51b can be a sliding surface. Also, by controlling the epitaxial growth condition (temperature, pressure, etc.) of GaN layer 51c, GaN layer Sic can be grown to align with the crystal plane of the surface of the Al nitride semiconductor layer 52b.

The same can be said when paying attention to a relation among Al nitride semiconductor layer 52a in composite layer 5, GaN layer 51a which is a foundation layer of Al nitride semiconductor layer 52a, and GaN layer 51b which is a layer above Al nitride semiconductor layer 52a. That is, the effect of the crystal structure of GaN layer 51a on the crystal structure of Al nitride semiconductor layer 52a is small, and the effect of the lattice constant value of GaN layer 51a on the lattice constant value of Al nitride semiconductor layer 52a is small. On the other hand, GaN layer 51b grows to align with the crystal plane of the surface of Al nitride semiconductor layer 52a as the foundation layer. Compression stress is added to GaN layer 51b due to the influence of Al nitride semiconductor layer 52a, and compressive strain is generated inside GaN layer 51b.

The function of composite layer 5 to generate convex shaped warpage becomes larger as the Al nitride semiconductor layer that composes composite layer 5 becomes thicker. On the other hand, if the Al nitride semiconductor layer that makes up composite layer 5 is too thick, cracks are likely to occur inside the Al nitride semiconductor layer. In order to effectively generate warpage of a convex shape by composite layer 5 while suppressing the generation of cracks inside the Al nitride semiconductor layer that composes composite layer 5, the thickness of each of the Al nitride semiconductor layers in composite layer 5 should be 3 nanometers or more and 50 nanometers or less, preferably 20 nanometers or less, and it is preferable that the number of Al nitride semiconductor layers in composite layer 5 is about 1 to 2.

According to this embodiment, by adjusting composite layer 4 which has a function to generate warpage of a concave shape in compound semiconductor substrate CS1 and composite layer 5 which has a function to generate warpage of a convex shape in compound semiconductor substrate CS1, the warpage of compound semiconductor substrate CS1 can be easily controlled.

In addition, since the semiconductor layers on the sliding surface boundary faces BR1 and BR2 can grow without being affected by the lattice constant value difference or distortion of the foundation layer, the generation of cracks can also be suppressed. Further, since the number of layers in composite layer 4 is small, compound semiconductor substrate CS2 can be easily prepared.

Second Embodiment

Figure 4:
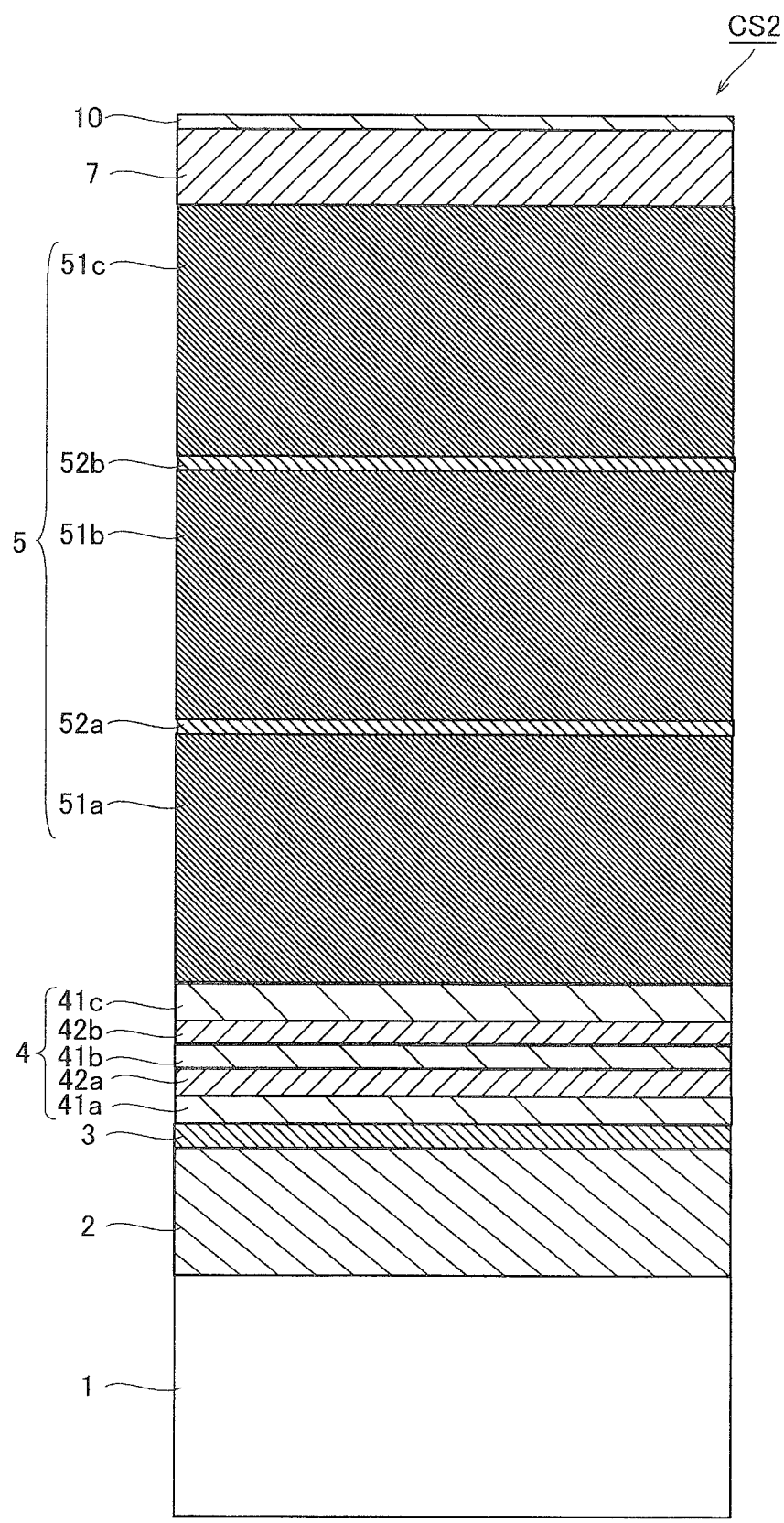
FIG. 4 shows a cross-sectional view showing the configuration of compound semiconductor substrate CS2 according to the second embodiment of the present invention.

FIG. 4 shows a cross-sectional view showing the configuration of compound semiconductor substrate CS2 in second embodiment of the present invention.

With reference to FIG. 4, composite layer 4 in this embodiment includes 3 Al nitride semiconductor layers 41a, 41b, and 41c (an example of multiple lower nitride semiconductor layers) as Al nitride semiconductor layers and 2 GaN layers 42a and 42b (an example of lower GaN layers) as GaN layers. Al nitride semiconductor layer 41a is formed at the position closest to Si substrate 1 among 3 Al nitride semiconductor layers 41a, 41b, and 41c and is in contact with AlN buffer layer 3. Al nitride semiconductor layer 41b is formed at the position second closest to Si substrate 1 among 3 Al nitride semiconductor layers 41a, 41b, and 41c. Al nitride semiconductor layer 41c is formed at the farthest position from Si substrate 1 among 3 Al nitride semiconductor layers 41a, 41b, and 41c. GaN layer 42a is formed between Al nitride semiconductor layer 41a and Al nitride semiconductor layer 41b. GaN layer 42b is formed between Al nitride semiconductor layer 41b and Al nitride semiconductor layer 41c.

Each of Al nitride semiconductor layer 41a, GaN layer 42a, and Al nitride semiconductor layer 41b has the same Al concentration distributions as in the case of the first embodiment shown in FIG. 2. The Al concentration of Al nitride semiconductor layer 41c is arbitrary. The Al concentration of Al nitride semiconductor layer 41c may decrease with distance from Si substrate 1 along the thickness direction, or may be constant along the thickness direction.

Assuming that the thickness of the GaN layer constituting composite layer 4 in this embodiment is the same as that of the first embodiment, the effect of generating warpage of a concave shape by composite layer 4 in this embodiment is larger than the effect of generating warpage of a concave shape by composite layer 4 of the first embodiment. For this reason, according to compound semiconductor substrate CS2, the warpage amount of a concave shape can be made larger than that of compound semiconductor substrate CS1. On the other hand, when the thickness of the GaN layer constituting composite layer 4 in the present embodiment is made thinner than that in the case of the first embodiment, it can be the warpage amount of compound semiconductor substrate CS2, which is equivalent to compound semiconductor substrate CS1.

Note that the configuration of compound semiconductor substrate CS2 other than the above is the same as the configuration of compound semiconductor substrate CS1 in first embodiment, the description will not be repeated.

According to this embodiment, the same effect as the first embodiment can be obtained.

EXAMPLES

The inventors of the present application conducted the following experiment as the first Example, in order to confirm the effect of reducing threading dislocations by forming GaN layer 42a.

Figure 5:
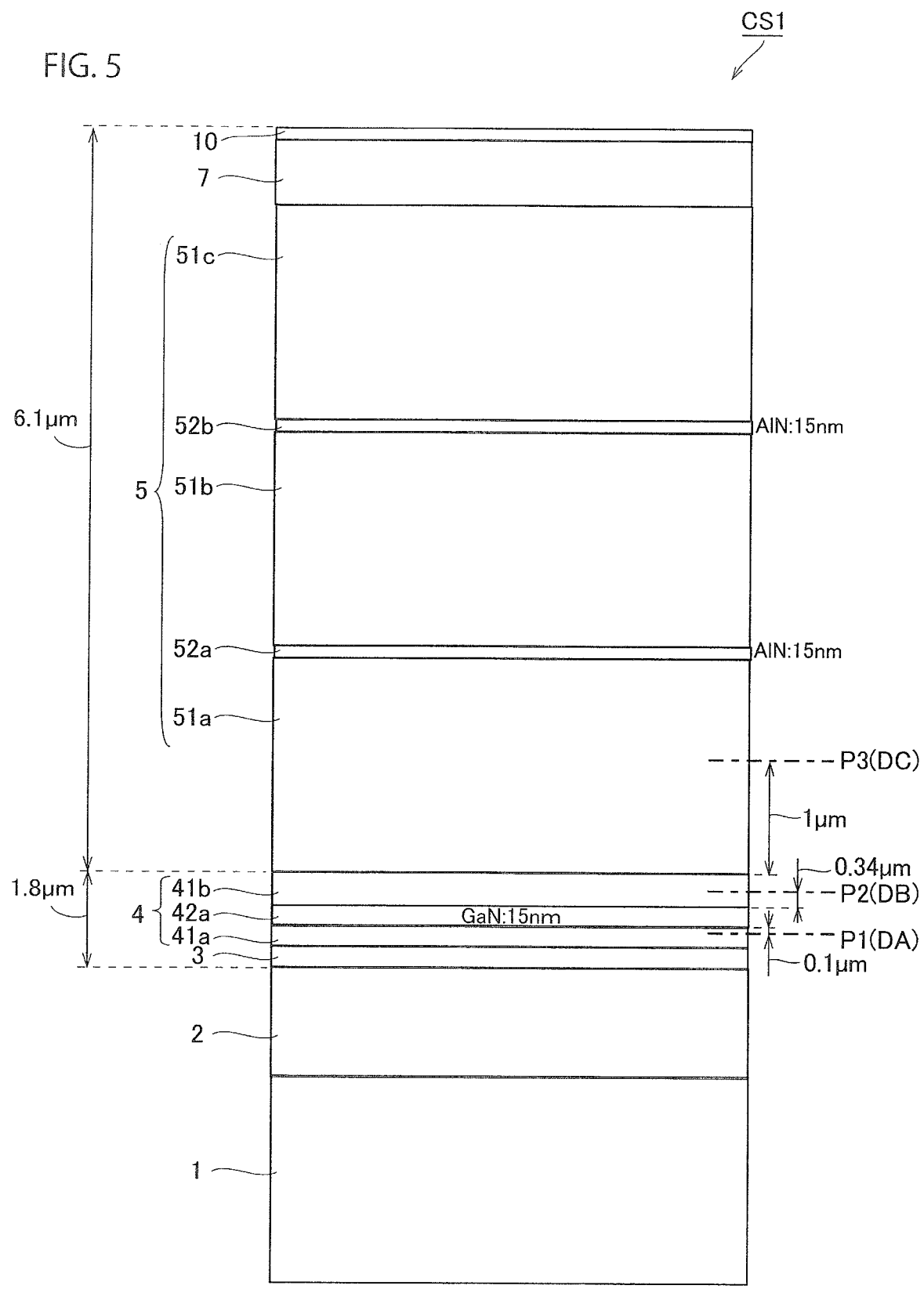
FIG. 5 shows a cross-sectional view indicating the production conditions of compound semiconductor substrate CS1 in the first embodiment of the present invention and the measurement positions P1, P2, and P3 of the number of the threading dislocations.

FIG. 5 shows a cross-sectional view indicating manufacturing conditions of compound semiconductor substrate CS1 in the first embodiment of the present invention and measurement positions P1, P2, and P3 of the number of threading dislocations.

With reference to FIG. 5, compound semiconductor substrate CS1 (a compound semiconductor substrate with GaN layer 42a) shown in FIG. 1 was prepared as Example A of the present invention. A 6-inch substrate with p+ type conductivity was used as Si substrate 1. Lower layer 411 and upper layer 412 were formed as Al nitride semiconductor layer 41a. The thickness of GaN layer 42a was set to 15 nanometers. The thickness of each of Al nitride semiconductor layers 52a and 52b was set to 15 nanometers.

In Example A of the present invention, the position of Al nitride semiconductor layer 41a separated from the boundary face with GaN layer 42a by 0.1 micrometers is defined as measurement position P1. Measurement position P2 is the position in Al nitride semiconductor layer 41b that is 0.34 micrometers upward from the boundary face with GaN layer 42a. The position in GaN layer 51a separated upward from the boundary face with Al nitride semiconductor layer 41b by 1 micrometer is defined as measurement position P3.

Next, the number of threading dislocations present in each cross section of measurement positions P1, P2, and P3 was measured by observation using a TEM (Transmission Electron Microscope). The number of measured threading dislocations was divided by the area of the cross section (here $9.25*10-9$ cm$^2$). As a result, the threading dislocation density DA at measurement position P1, the threading dislocation density DB at measurement position P2, and the threading dislocation density DC at measurement position P3 were calculated.

Next, the ratio of threading dislocation density DB to threading dislocation density DA (DB/DA) was calculated by dividing the threading dislocation density DB by the threading dislocation density DA. Similarly, the ratio of threading dislocation density DC to threading dislocation density DA (DC/DA) was calculated by dividing the threading dislocation density DC by the threading dislocation density DA. Note that the small ratio (DB/DA) means that the decrease rate of the threading dislocation density DB in Al nitride semiconductor layer 41b is large. The small ratio (DC/DA) means a large reduction in the threading dislocation density DC within the GaN layer 51a.

Figure 6:
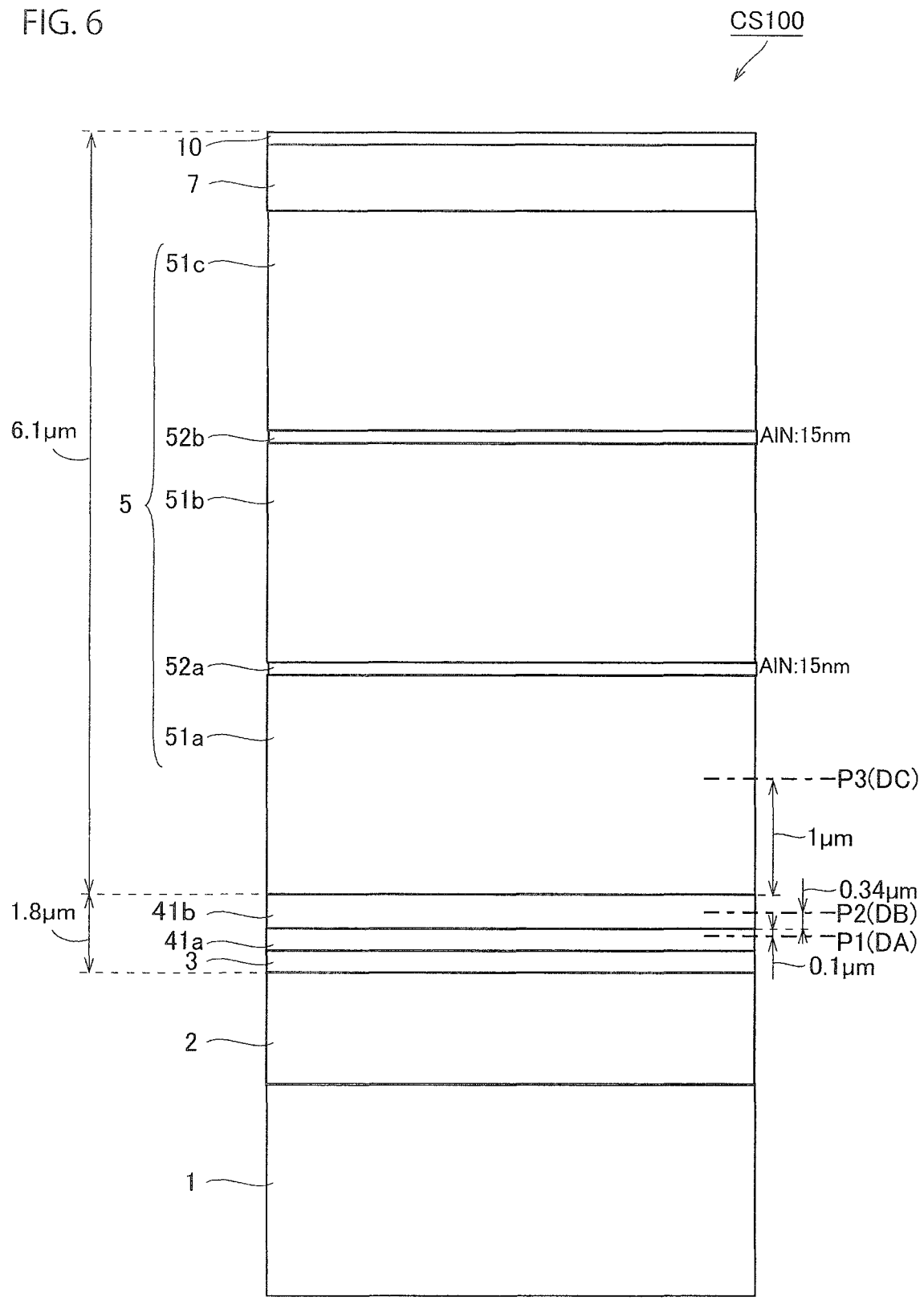
FIG. 6 shows a cross-sectional view indicating the production conditions of compound semiconductor substrate CS100 in the first embodiment of the present invention and the measurement positions P1, P2, and P3 of the number of the threading dislocation.

FIG. 6 shows manufacturing conditions of compound semiconductor substrate CS100 in the first embodiment of the present invention and a cross-sectional view showing measurement positions P1, P2, and P3 of the number of threading dislocations.

With reference to FIG. 6, compound semiconductor substrate CS100 without GaN layer 42a (a compound semiconductor substrate without GaN layer 42a) was prepared as Comparative Example B. The configuration of compound semiconductor substrate CS100 except that GaN layer 42a is not included is the same as that of compound semiconductor substrate CS1 of Example A of the present invention.

In Comparative Example B, the position of Al nitride semiconductor layer 41a at a distance of 0.1 micrometers downward from the boundary face with Al nitride semiconductor layer 41b was defined as measurement position P1. The position in Al nitride semiconductor layer 41b separated upward from the boundary face with Al nitride semiconductor layer 41a by 0.34 micrometers was defined as measurement position P2. The position in GaN layer 51a separated upward from the boundary face with Al nitride semiconductor layer 41b by 1 micrometer was defined as measurement position P3.

Next, using the same method as in Example A of the present invention, the threading dislocation density DA at measurement position P1, the threading dislocation density DB at measurement position P2, and the threading dislocation density DC at measurement position P3 were calculated, and the ratio (DB/DA) and ratio (DC/DA) were calculated.

FIG. 7 is a diagram showing the measurement result of the threading dislocation densities in the first Example of the present invention.

With reference to FIG. 7, in Example A of the present invention, the threading dislocation density DA at measurement position P1 is $9.6*10^9$ pieces/cm$^2$, and the threading dislocation density DB at measurement position P2 is $5.2*10^9$ pices/m$^2$, and the threading dislocation density DC at measurement position P3 was $2.2*10^9$ pieces/cm$^2$. The ratio (DB/DA) is 0.55 and the ratio (DC/DA) is 0.23.

In addition, in Example A of the present invention, threading dislocation densities DA of multiple measurement positions P1 having different depths in Al nitride semiconductor layer 41a were measured, threading dislocation densities DB of multiple measurement positions P2 having different depths in Al nitride semiconductor layer 41b were measured, and threading dislocation densities DC of multiple measurement positions P3 having different depths in GaN layer 51a were measured. As a result, the ratios (DB/DA) were greater than 0 and equal to or less than 0.6, and the ratios (DC/DA) were greater than 0 and equal to or less than 0.3 for all measurement position combinations.

In Comparative Example B, the threading dislocation density DA at measurement position P1 is $1.1*10^{10}$ pieces/cm$^2$, the threading dislocation density DB at measurement position P2 is $7.2*10^9$ pieces/cm$^2$, and the threading dislocation density DC at measurement position P3 is $3.8*10^9$ pieces/cm$^2$. The ration (DB/DA) is 0.67, and the ratio (DC/DA) is 0.35.

In Comparative Example B, the threading dislocation densities DA of multiple measurement positions P1 having different depths in Al nitride semiconductor layer 41a were measured, the threading dislocation densities DB of multiple measurement positions P2 having different depths in Al nitride semiconductor layer 41b were measured, and threading dislocation densities DC of multiple measurement positions P3 having different depths in GaN layer 51a were measured. As a result, the ratios (DB/DA) were greater than 0.6 and the ratios (DC/DA) were greater than 0.3 for all measurement position combinations.

From the above results, according to Example A of the present invention, it can be seen that the threading dislocation density in Al nitride semiconductor layer 41b is lower than the threading dislocation density in Al nitride semiconductor layer 41a. It can also be seen that with the introduction of GaN layer 42a, threading dislocations in Al nitride semiconductor layer 41b is greatly reduced, and threading dislocations in GaN layer 51a is greatly reduced.

Subsequently, the inventors of the present application measured the density of etch pits present on the surface of the most superficial layer (Al nitride semiconductor layer 10) of compound semiconductor substrate CS1 for each of Example A and Comparative example B of the present invention. The surface of Al nitride semiconductor layer 10 of each of Example A of the present invention and Comparative example B was etched with a molten KOH (potassium hydroxide) solution to corrode the surface of Al nitride semiconductor layer 10. It is known that typically, by etching with molten KOH solution, crystal surface parts with large lattice distortion or dislocation core parts with uncombine hands are selectively etched. Next, the surface of Al nitride semiconductor layer 10 was observed under a microscope, and the number of etch pits (hereinafter sometimes referred to as etch pits (large)) that are larger than a specified size and exist in the area of the specified size (here, the area of $4.32*10^{-4}$ cm$^2$) of the surface of Al nitride semiconductor layer 10 was measured. Then, the density of etch pits (large) was calculated by dividing the number of etch pits (large) by the area of the observed area. Similarly, the density of etch pits (small) is calculated by measuring the number of etch pits (hereinafter sometimes referred to as etch pits (small)) smaller than the specified size existing in the area (here, the area of $2.50*10^4$ cm$^2$) of surface of Al nitride semiconductor layer 10.

It is presumed that etch pits (large) are derived from minute defects such as nanopipes based on conventional knowledge. It is presumed that etch pits (small) is derived from threading dislocations from the density level.

FIG. 8 shows micrographs, and the density measurement results of etch pits of the surface of the most superficial layer (Al nitride semiconductor layer 10) of the compound semiconductor substrate in the first embodiment of the present invention.

With reference to FIG. 8, in Example A of the present invention, the density of etch pits (large) was $7.87*10^4$ pieces/cm$^2$. The density of etch pits (small) was $1.04*10^8$ pieces/cm$^2$. In Comparative example B, the density of etch pits (large) was $2.78*10^5$ pieces/cm$^2$. The density of etch pits (small) was $1.40*10^8$ pieces/cm$^2$.

From the above results, it can be seen that the introduction of GaN layer 42a significantly reduces the minute defects and the threading dislocations in GaN layer 51a.

As the second Example, the inventors of the present application conducted the following experiment in order to confirm the effect of controlling the warpage by the compound semiconductor substrate of the present invention.

Three types of compound semiconductor substrates CS2 with GaN layer 42b thicknesses of 15 nanometers (sample C1), 45 nanometers (sample C2), and 60 nanometers (sample C3) were made. In samples C1, C2, and C3, the thickness of each of Al nitride semiconductor layers 52a and 52b is set to 15 nanometers, and the thickness of GaN layer 42a is set to 15 nanometers. Al nitride semiconductor layers 52a and 52b were designated as AlN. The warpage amount of the obtained compound semiconductor substrate CS2 was measured.

Figure 10:
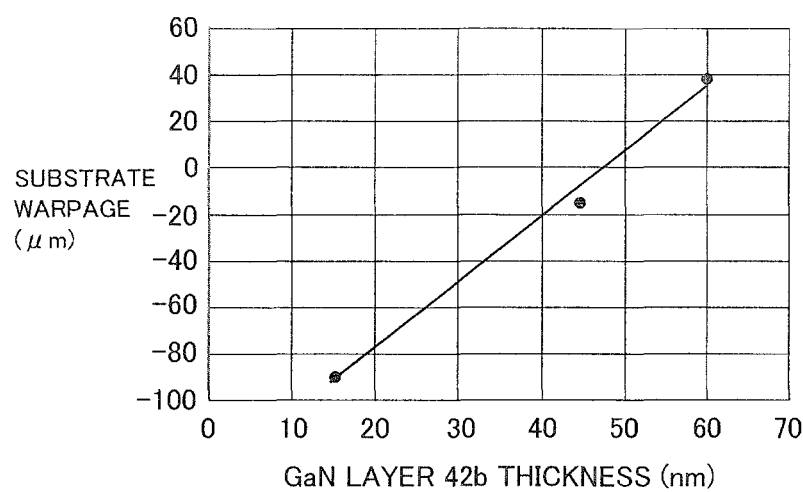
FIG. 10 shows a graph showing the relationship between the thickness of GaN layer 42b and the warpage amount obtained from the measurement result of the warpage amounts of samples C1, C2, and C3 in the second embodiment of the present invention.
Figure 12:
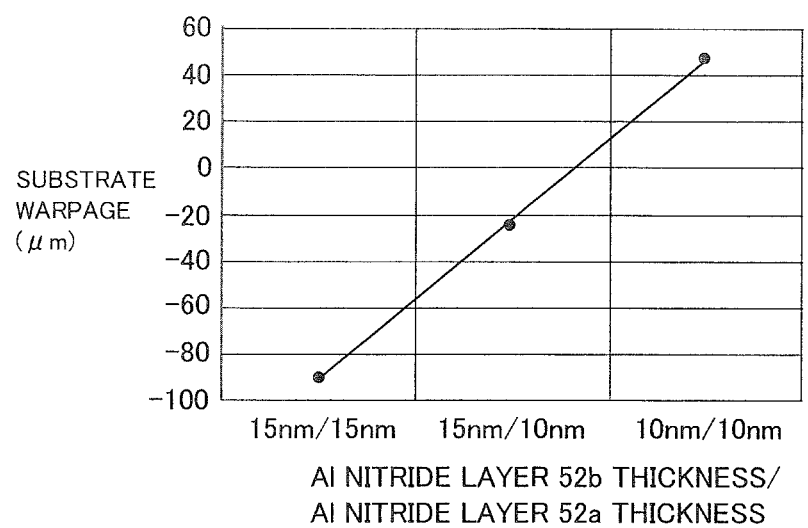
FIG. 12 shows a graph showing the relationship between the thicknesses of Al nitride semiconductor layer 52a and 52b and the warpage amounts obtained from the measurement result of the warpage amounts of samples D1, D2, and D3 in the second embodiment of the present invention.

FIG. 9 shows the measurement result of the warpage amounts of samples C1, C2, and C3 in the second embodiment of the present invention. FIG. 10 shows a graph showing the relationship between the thickness of GaN layer 42b obtained from the measurement result of the warpage amounts of samples C1, C2, and C3 in the second embodiment of the present invention and the warpage amount. In FIGS. 10 and 12, the direction of warpage which is a convex shape is negative, and the direction of warpage which is a concave shape is positive.

With reference to FIGS. 9 and 10, sample C1 with a thickness of 15 nanometer of GaN layer 42*b* is in a convex shape and the warpage amount is 90 micrometers. Sample C2 with thickness of 45 nanometers of GaN layer 42*b* is in a convex shape and the warpage amount is 15 micrometers. Sample C3 with thickness of 60 nanometers of GaN layer 42*b* is in a concave shape and the warpage amount is 39 micrometers. In addition, as the thickness of GaN layer 42*b* increased, the warpage amount of compound semiconductor substrate CS2 increased at a substantially constant rate in the direction of the concave shape.

Next, three types of compound semiconductor substrate CS2 of which the thickness of Al nitride semiconductor layer 52*b*/the thickness of Al nitride semiconductor layer 52*a* is 15 nanometers/15 nanometers (sample D1), 15 nanometers/10 nanometers (sample D2), and 10 nanometers/10 nanometers (sample D3) were prepared. For samples D1, D2, and D3, the thickness of each of GaN layers 42*a* and 42*b* was set to 15 nanometers. Al nitride semiconductor layers 52*a* and 52*b* were designated as AlN. The warpage amount of the obtained compound semiconductor substrate CS2 was measured.

FIG. 11 shows the measurement result of the warpage amounts of samples D1, D2, and D3 in the second embodiment of the present invention. FIG. 12 shows a graph of a relationship between thickness of Al nitride semiconductor layer 52*a* and 52*b* and the warpage amount, obtained by the measurement result of the warpage amounts of samples D1, D2, and D3 in the second embodiment of the present invention.

With reference to FIGS. 11 and 12, sample D1 in which the thickness of Al nitride semiconductor layer 52*b*/the thickness of Al nitride semiconductor layer 52*b* is 15 nanometers/15 nanometers has the warpage amount of 90 micrometers in a convex shape. Sample D2, in which the thickness of Al nitride semiconductor layer 52*b*/the thickness of Al nitride semiconductor layer 52*b* is 15 nanometers/10 nanometers, has the warpage amount of 23 micrometers in a convex shape. Sample D3, in which the thickness of Al nitride semiconductor layer 52*b*/the thickness of Al nitride semiconductor layer 52*b* is 10 nanometers/10 nanometers has the warpage amount of 46 micrometers in a concave shape. Also, while the sum total value of the Al nitride semiconductor layer 52*b* thickness and the Al nitride semiconductor layer 52*b* thickness decreased, the warpage amount of compound semiconductor substrate CS2 increased at a substantially constant rate in the direction of a concave shape.

From the above experimental results, by adjusting the thickness of the GaN layer that makes up composite layer 4 or the thickness of the Al nitride semiconductor layer that makes up composite layer 5, it turns out that the warpage of compound semiconductor substrate CS1 can be easily controlled.

[Others]

The compound semiconductor substrate of the present invention should comprise a Si substrate, a first nitride semiconductor layer containing Al formed on the Si substrate, which is a graded layer in which the Al concentration decreases as the distance from the Si substrate increases in the thickness direction, a second nitride semiconductor layer formed on the first nitride semiconductor layer with a lower average Al concentration than the average Al concentration of the first nitride semiconductor layer, and a third nitride semiconductor layer containing Al formed on the second nitride semiconductor layer and having a higher average Al concentration than the average Al concentration of the second nitride semiconductor layer. As an example, the composite layer 5, GaN layer 7, and Al nitride semiconductor layer 10 in FIG. 1 may be omitted, or other layer(s) may be formed in place of these layers.

The above-described embodiments can be combined as appropriate.

The embodiments and examples described above are to be considered as illustrative in all points and not restrictive. The scope of the present invention is shown not by the above description but by the scope of the claims, and is intended to include meanings equivalent to the scope of the claims and all modifications within the scope.

EXPLANATION OF SYMBOLS

1 Si substrate
2 SiC layer
3 AlN buffer layer
4, 5 composite layer
7, 42*a*, 42*b*, 51*a*, 51*b*, 51*c* GaN layer
10, 41*a*, 41*b*, 41*c*, 52*a*, 52*b* Al nitride semiconductor layer
411 lower layer
412 upper layer
BR1, BR2 boundary face
CS1, CS2, CS100 compound semiconductor substrate
EP etch pit
P1, P2, P3 measurement position of the number of threading dislocations
TD threading dislocation

What is claimed is:

1. A compound semiconductor substrate comprising:
a Si substrate,
a first nitride semiconductor layer containing Al formed on the Si substrate, as a graded layer in which an Al concentration decreases as a distance from the Si substrate increases along a thickness direction,
a second nitride semiconductor layer formed on the first nitride semiconductor layer and having a lower average Al concentration than the average Al concentration of the first nitride semiconductor layer, and
a third nitride semiconductor layer containing Al formed on the second nitride semiconductor layer and having a higher average Al concentration than the average Al concentration of the second nitride semiconductor layer, wherein
a threading dislocation density at any position in a thickness direction within the third nitride semiconductor layer is lower than a threading dislocation density at any position in a thickness direction within the first nitride semiconductor layer,
at least a part of a threading dislocation that existed in the first nitride semiconductor layer is covered by the second nitride semiconductor layer, and
a boundary face between the first nitride semiconductor layer and the second nitride semiconductor layer is a sliding surface.

2. The compound semiconductor substrate according to claim 1, wherein
the second nitride semiconductor layer is made of GaN and has a thickness of 3 nanometers or more and 100 nanometers or less.

3. The compound semiconductor substrate according to claim 1, wherein
the first nitride semiconductor layer includes a lower layer, and an upper layer formed on the lower layer and having a lower average Al concentration than an average Al concentration of the lower layer.

4. The compound semiconductor substrate according to claim 1, wherein when a threading dislocation density at any position in a thickness direction within the first nitride semiconductor layer is threading dislocation density DA, and a threading dislocation density at any position in a thickness direction within the third nitride semiconductor layer is threading dislocation density DB, a ratio (DB/DA) of threading dislocation density DB to threading dislocation density DA is greater than 0 and less than or equal to 0.6.

5. The compound semiconductor substrate according to claim 1, wherein a ratio (W2/W1) of the second nitride semiconductor layer thickness W2 to a first nitride semiconductor layer thickness W1 is 0.007 or more and 0.26 or less.

6. The compound semiconductor substrate according to claim 1, further comprising a GaN layer formed on the third nitride semiconductor layer.

7. The compound semiconductor substrate according to claim 6, wherein when a threading dislocation density at any position in a thickness direction within the first nitride semiconductor layer is threading dislocation density DA, and a threading dislocation density at any position in a thickness direction within the GaN layer is threading dislocation density DC, a ratio (DC/DA) of threading dislocation density DC to threading dislocation density DA is greater than 0 and less than or equal to 0.3.

8. The compound semiconductor substrate according to claim 6, further comprising an upper composite layer, wherein the upper composite layer includes multiple upper GaN layers stacked in a vertical direction, and upper nitride semiconductor layer(s) containing Al formed between the multiple upper GaN layers, wherein the GaN layer is an upper GaN layer of the lowermost layer among the multiple upper GaN layers, and a ratio (W4/W3) of thickness W4 of the upper nitride semiconductor layer to thickness W3 of each of the multiple upper GaN layer is 0.0015 or more and 0.025 or less.

9. The compound semiconductor substrate according to claim 1, further comprising a SiC layer formed on the Si substrate, and a buffer layer consisting of AlN formed on the SiC layer, wherein the first nitride semiconductor layer is formed on the buffer layer.

* * * * *